United States Patent

Ogushi

Patent Number: 5,760,878
Date of Patent: Jun. 2, 1998

[54] EXPOSURE APPARATUS AND ALIGNMENT DISCRIMINATION METHOD

[75] Inventor: Nobuaki Ogushi, Utsunomiya, Japan

[73] Assignee: Canon Kabushiki Kaisha, Tokyo, Japan

[21] Appl. No.: 702,326

[22] Filed: Aug. 23, 1996

[30] Foreign Application Priority Data

Aug. 30, 1995 [JP] Japan ............... 7-243980
Jan. 11, 1996 [JP] Japan ............... 8-019236

[51] Int. Cl.$^6$ ............... G03B 27/42; G03B 27/32; G01B 11/00
[52] U.S. Cl. ............... 355/53; 355/77; 356/399; 356/400; 356/401
[58] Field of Search ............... 355/53, 67, 72, 355/77, 75; 356/399, 400, 401; 250/201.1, 548, 559, 559.3

[56] References Cited

U.S. PATENT DOCUMENTS

| | | |
|---|---|---|
| 4,595,282 | 6/1986 | Takahashi . |
| 5,532,822 | 7/1996 | Shinozaki et al. ............ 356/399 X |
| 5,539,497 | 7/1996 | Nishi ............ 355/53 O |
| 5,633,720 | 5/1997 | Takahashi ............ 356/401 O |

FOREIGN PATENT DOCUMENTS

| | | |
|---|---|---|
| 0440470 | 8/1991 | European Pat. Off. . |
| 2131205 | 6/1984 | United Kingdom . |

Primary Examiner—R. L. Moses
Assistant Examiner—Shival Virmani
Attorney, Agent, or Firm—Fitzpatrick, Cella, Harper & Scinto

[57] ABSTRACT

A discrimination apparatus and method usable in an exposure apparatus for transferring a pattern of an original onto a substrate includes a device and step for producing information related to the relative positional deviation between the original and the substrate, and a device and step for discriminating an error shot on the basis of the information. The condition for positioning discrimination is changed in accordance with a layer or shot.

16 Claims, 8 Drawing Sheets

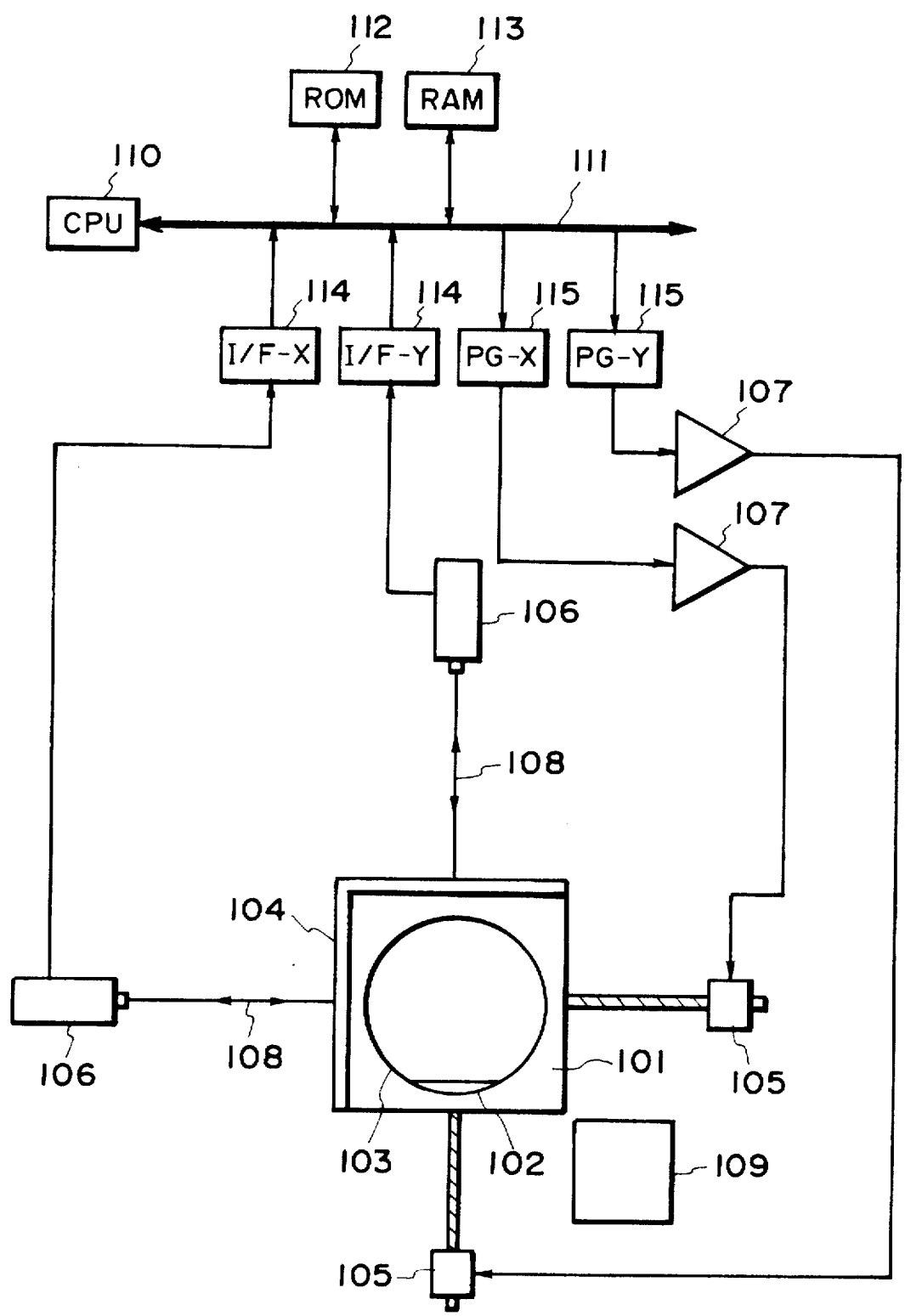
F I G. 1

EXPOSURE APPARATUS AND ALIGNMENT DISCRIMINATION METHOD

FIELD OF THE INVENTION AND RELATED ART

This invention relates to an exposure apparatus and a method usable therein for discriminating an error shot. More particularly, the invention is concerned with an exposure apparatus and a method therefor for evaluating the state of positioning of a high-precision positioning X-Y stage, by which any error shot can be discriminated correctly and by which the throughput of an exposure process of a rough layer can be improved. That is, the invention provides a method for evaluating the state of positioning of a high-precision positioning X-Y stage and for discriminating the positioning.

Exposure apparatuses for transferring and printing a pattern of a reticle or mask (original) onto a wafer placed on an X-Y stage, are equipped with an X-Y stage control circuit which serves to sample, during the exposure process the difference between a measured position and a specified target position and, if the difference goes beyond a tolerance, it discriminates the exposure shot as being an error shot.

Also, there is an X-Y stage control circuit of an exposure apparatus which operates to sample, during the positioning operation, a difference between a measured position and a specified target position and, if the amplitude comes into a certain tolerance within a particular time period, it discriminates that the positioning is completed.

SUMMARY OF THE INVENTION

These controlling methods however involve a problem that, if the exposure condition changes, for example in cases where the exposure time is long or short or where the layer is critical or rough, it is difficult to correctly discriminate whether the exposure process has been completed to satisfy the requirement.

It is accordingly an object of the present invention to ensure that discrimination of an error shot is made correctly in an exposure apparatus.

In accordance with an aspect of the present invention, to achieve the above object, in an exposure apparatus for transferring a pattern of an original onto a substrate, information, which represents the relative positional deviation between the original and a wafer, is produced and discrimination of an error short is made on the basis of that information.

More specifically, during an exposure period, the relative positional deviation information is sampled at predetermined intervals and is stored, and the resultant data is statistically processed to execute error shot discrimination. The statistical processing includes the calculation of an average and a standard deviation of the positional deviation information. The error shot discrimination is carried out on the basis of whether the average and the standard deviation satisfy a predetermined registration precision between the original and the substrate and a predetermined resolution. The average of the positional deviation information represents a registration error between the original and the substrate, and the standard deviation of the positional deviation information corresponds to resolution of a transferred image. Thus, based on the average and the standard deviation, correct discrimination of error shot can be made.

The predetermined registration precision and resolution may be changed in accordance with an exposure layer and with specifications required for that exposure layer. In cases involving a rough layer, the ranges for the registration precision and resolution may be widened. Thus, for rough layers, a drive system, which may be a source of external disturbance to the exposure process (such as a conveying system, for example), may be driven during the exposure period, by which the throughput can be enhanced.

On the other hand, in conventional methods described hereinbefore, a discrimination of whether the amplitude comes into a predetermined tolerance within a predetermined time period is made under the same condition even though the exposure condition changes as in cases where the exposure time is long or short or where the layer is critical or rough. Thus, there is a possibility that discrimination is not completed until vibration is attenuated excessively. This is not desirable from the viewpoint of higher speed operation of the apparatus.

It is another object of the present invention to ensure a higher operation speed of an exposure apparatus without deteriorating the basis performance of the apparatus.

In accordance with an aspect of the present invention, to achieve this object, in the positioning of an X-Y stage, a positioning discrimination condition, such as a threshold or a positioning time, for example, is changed when the exposure condition is changed, as in cases where the layer is critical or rough or where the exposure time is long or short.

With this feature of the present invention, the tolerance for discrimination of convergence of vibration in the positioning operation is determined in accordance with the specification of resolution as required. Thus, particularly for rough layers, the positioning time can be shortened and, therefore, the throughput of the apparatus can be enhanced.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of an X-Y stage and an X-Y stage control circuit of an exposure apparatus according to an embodiment of the present invention.

DESCRIPTION OF THE PREFERRED EMBODIMENTS

Figure 2A:
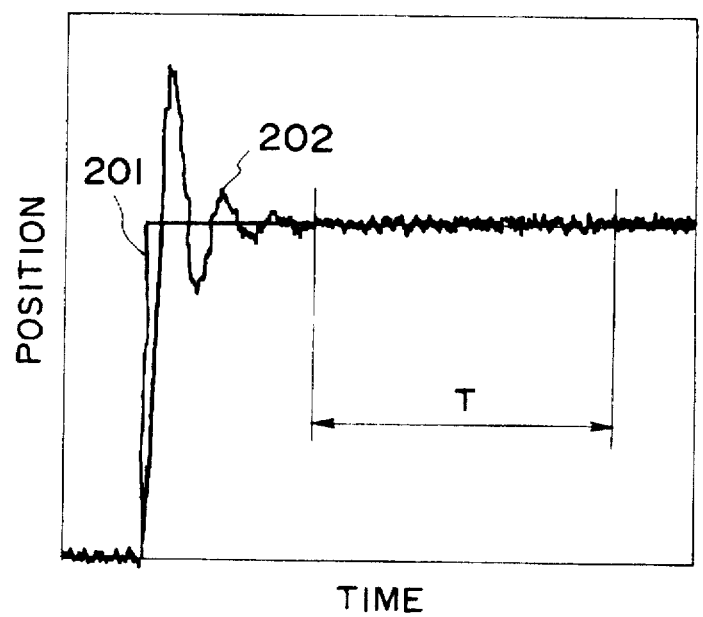
FIGS. 2A and 2B are graphs for explaining the responsiveness of the X-Y stage to a designated value.

FIG. 1 is a schematic and diagrammatic view of an X-Y stage and an X-Y stage control circuit according to an embodiment of the present invention. Denoted in FIG. 1 at 101 is an X-Y stage, and denoted at 102 is a wafer chuck for holding a wafer 103. Denoted at 105 are an X-axis motor and a Y-axis motor, and denoted at 107 are drivers for the motors 105. Denoted at 106 is a laser distance measuring device for detecting the position of the X-Y stage 101. Laser beam 108, emitted by the laser distance measuring device 106, is reflected by a mirror 104 fixedly mounted on the X-Y stage 101, and it enters again the laser distance measuring device 106, by which the position of the X-Y stage 101 is detected. Denoted at 109 is an off-axis type global alignment system in which, prior to the exposure process, the X-Y stage 101 is moved to a site below the alignment system 109 and a positional deviation of an exposure pattern on the wafer 103 is measured beforehand. The result is reflected by a designation value for driving the stage for the exposure process.

The X-Y stage control circuit includes a CPU 110 and a bus 111. A ROM 112 has a control program stored therein, and a RAM 113 serves to execute the control program or to store positional data. As a designation of a drive amount to the motor 105, the CPU 110 sets a drive amount to a pulse generator 115 through the bus 111, and it is transmitted to the driver 107. The positional data from the laser distance measuring device 106 is transmitted to the CPU 110 or to the RAM 113, from an interface 114 and through the bus 111.

FIG. 2A shows the responsiveness of the X-Y stage 110 to a stepwise designated value. As seen in the drawing, a designated value 201 changes stepwise, whereas a detected position 202 shows a delay at its rise and, after overshooting, it is converged and the exposure is done in time T of FIG. 2A. High frequency vibration continues after convergence.

Figure 2B:
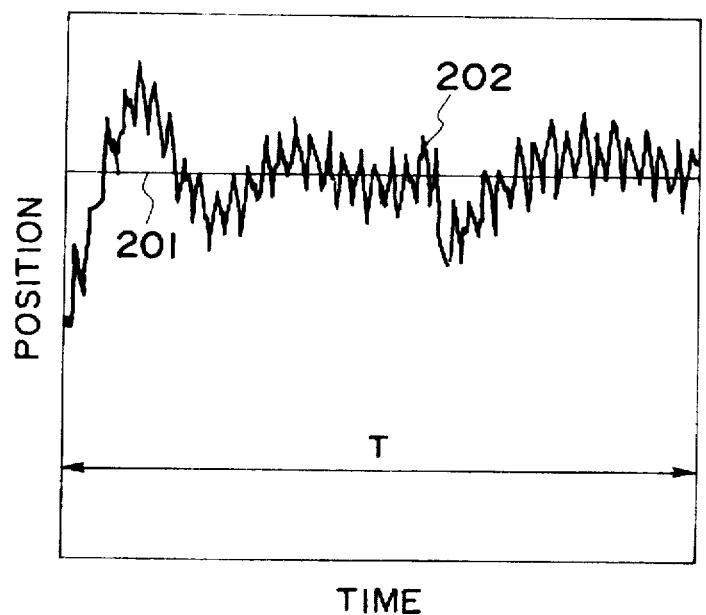

FIG. 2B is an enlarged view of a portion of the exposure time T in FIG. 2A, and it shows a case where the detected position 202 converges gradually and a case where external vibration is applied. Such vibration adversely affects registration precision and resolution of exposure performance.

The details of such adverse effect will be explained below.

Figure 3:
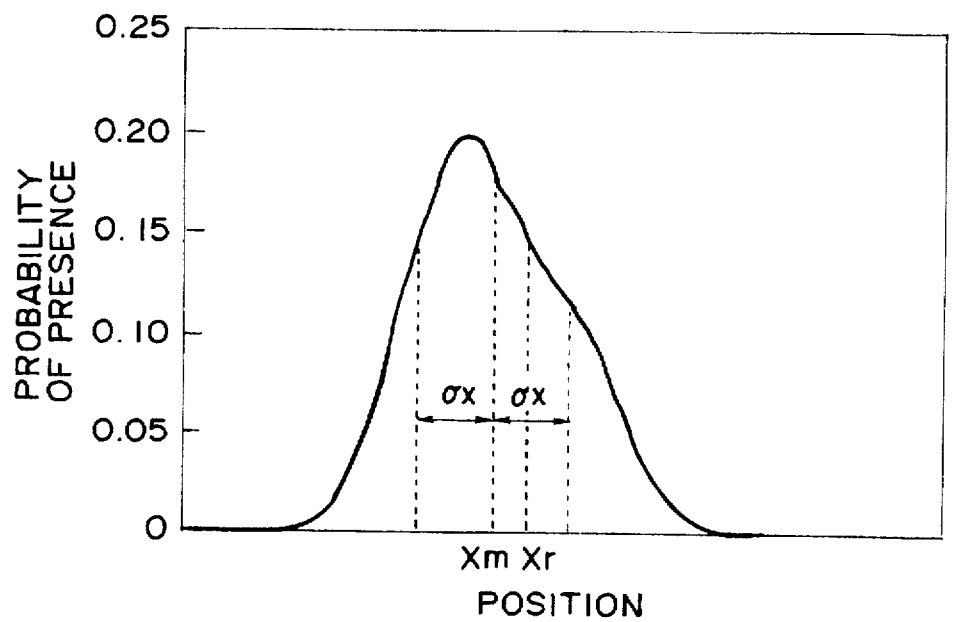
FIG. 3 is a graph for explaining a probability of presence in the position of the X-Y stage.

FIG. 3 shows a position change in FIG. 2B in terms of the probability of presence at a position. It is illustrated that, to a designated value Xr with respect to the X axis, a mean Xm is deviated. The mean Xm is represented by equation (1) below:

$$Xm = 1/T \int_0^T X(t) dt \tag{1}$$

Here, the difference Xc ($\approx$Xr–Xm) between Xr and Xm directly leads to a registration error. Overall registration precision will be 60 nm in a case of 0.25 micron L&S (a pattern consisting of line and spaces of a width 0.25 micron) and 40 nm in a case of 0.15 micron L&S. Of it, the positioning precision of the X-Y stage 101 will be, for example, 10 nm in the case of 0.25 micron L&S and 6 nm in the case of 0.15 micron L&S. Also, the standard deviation σx representing the dispersion degrades the resolution. The standard deviation σ is expressed by equation (2) below:

$$\sigma x = \sqrt{\left\{ (1/T) \int_0^T (X(t) - Xm)^2 dt \right\}} \tag{2}$$

Similarly, the same procedure will be taken in regard to the Y axis and any other axis.

In a case where the intensity of the light source changes largely during the exposure time T, weighting has to be done in accordance with light quantity. If the function of intensity is denoted by I(t), equations (1) and (2) should be rewritten as equations (3) and (4) below:

$$Xm = (1/T) \int_0^T X(t) I(t) dt / \int_0^T I(t) dt \tag{3}$$

$$\sigma x = \sqrt{\left\{ (1/T) \int_0^T (X(t) - Xm)^2 I(t) dt / \int_0^T I(t) dt \right\}} \tag{4}$$

Figure 4:
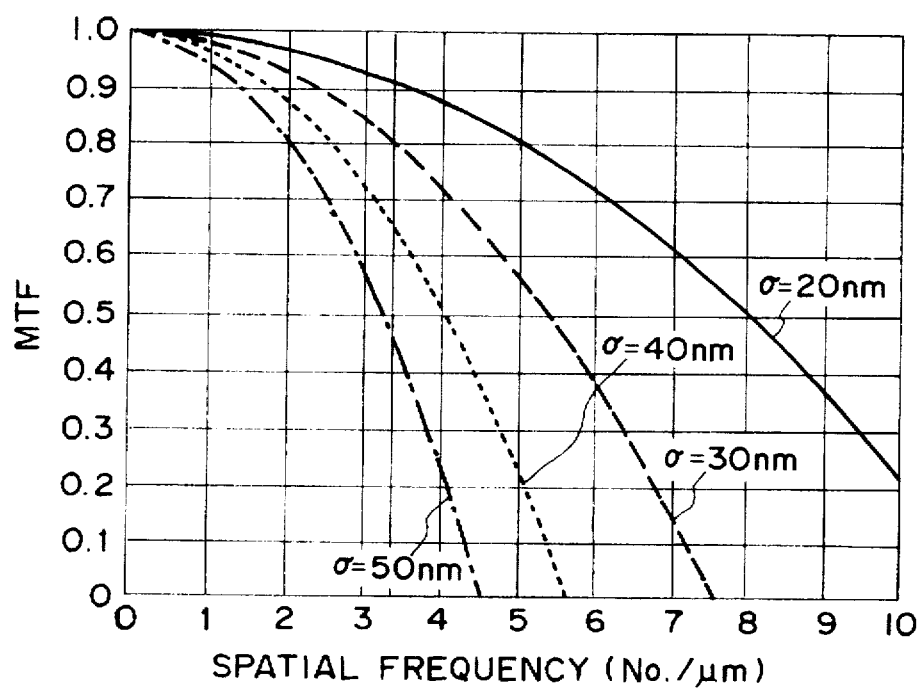
FIG. 4 is a graph for explaining the relation between a spatial frequency and a MTF.

Also, generally an MTF (modulation transfer function) is used as a value which represents the resolution. FIG. 4 illustrates that the MTF decreases with an increase in the spatial frequency and with enlargement of σ. The σ is a standard deviation of an ordinary axis (e.g., X or Y axis). If the spatial frequency is denoted by u, the MTF can be expressed approximately by equation (5) below:

$$MTF = exp(-2\pi^2 \sigma^2 u^2) \approx 1 - 2\pi^2 \sigma^2 u^2 \tag{5}$$

If an MTF not less than 0.8 attributes the resolving for 0.25 micron L&S, the spatial frequency u becomes equal to two per micron (2/micron). Thus, from FIG. 4, it is seen that vibration of up to σ=50 nm is tolerable. Similarly, for 0.15 micron L&S, the spatial frequency u is 3.5 per micron and vibration of up to σ=30 nm is tolerable.

Exposure specifications may be summarized as Table 1 below:

TABLE 1

| L & S(micron) | Positioning Precision (nm) | Tolerable Amplitude(σ)(nm) |
|---|---|---|
| 0.25 | 10 | 50 |
| 0.15 | 6 | 30 |

In this embodiment, in accordance with the above specifications, during the exposure period the positional information related to the X-Y stage 101 is stored, this being for executing error shot discrimination just after completion of the exposure. More specifically, the sampling is carried out with a rate twice or more of a major frequency component of vibration. By executing a calculation in accordance with equations (1) and (2) or equations (3) and (4) and on the basis of whether the exposure specifications at Table 1 are satisfied or not, the error shot discrimination is made. Also, the exposure specifications at Table 1 are those for a critical layer. There is a wider tolerance for rough layers. Thus, a different driving portion, which may be a source of external disturbance during the exposure process, such as a conveying system, for example, may be actuated during the exposure process, this being effective to enhance the throughput. Further, if the exposure time is longer, the operation time of the driving portion may be prolonged.

By quantitatively evaluating the vibration during the exposure time as described above, for rough layers, not only the error shot discrimination but also the margin can be estimated quantitatively. Thus, even a drive that may cause external disturbance may be executed within a predetermined range, to increase the throughput.

Figure 5:
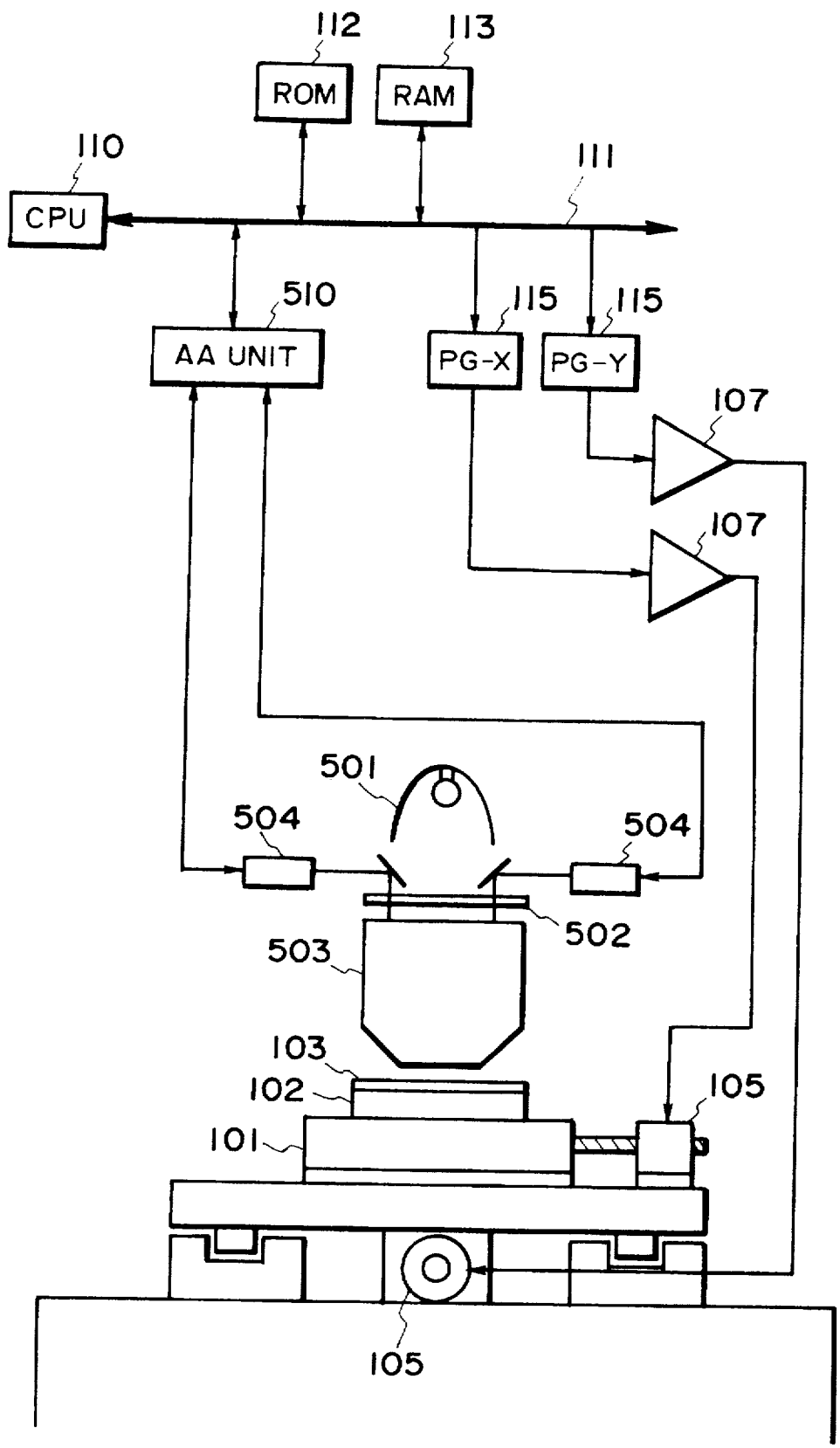
FIG. 5 is a schematic and diagrammatic view of an exposure apparatus with a real time AA (autoalignment) function and a control circuit thereof, according to another embodiment of the present invention.

FIG. 5 is a block diagram of a control circuit of an exposure apparatus having a real time AA function, according to another embodiment of the present invention. Denoted in FIG. 5 at 501 is an exposure light source, and denoted at 502 is a reticle. Denoted at 503 is a lens optical system, and denoted at 504 are pickups for detecting the positional deviation between the reticle 502 and a wafer 103 in real time fashion. Detection signals from the pickups 504 are transformed by an AA unit 510 into positional information, which is applied to the CPU 110 or RAM 113 through the bus 111.

Figure 6:
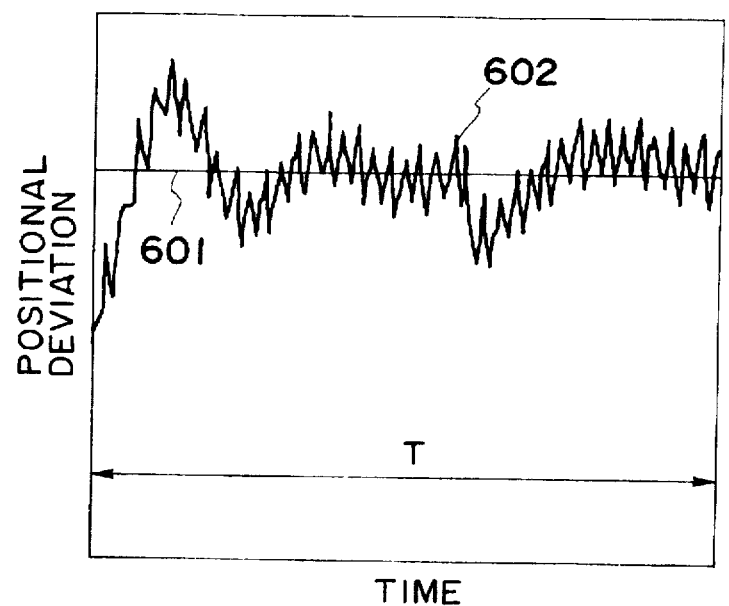
FIG. 6 is a graph for explaining the positional deviation between a reticle and a wafer during an exposure period.

FIG. 6 shows a result of detection of positional deviation, obtained by real time autoalignment, and it illustrates changes in a positional deviation 602 to a designated value 601 during the exposure time T. Like the preceding embodiment, the error shot discrimination is made by determining a standard deviation and a mean in relation to respective axes on the basis of the resultant data. Since in this embodiment the relative position of the reticle 502 and the wafer 103 is detected, more accurate error shot discrimination is attainable in this embodiment as compared with the preceding embodiment.

Figure 7:
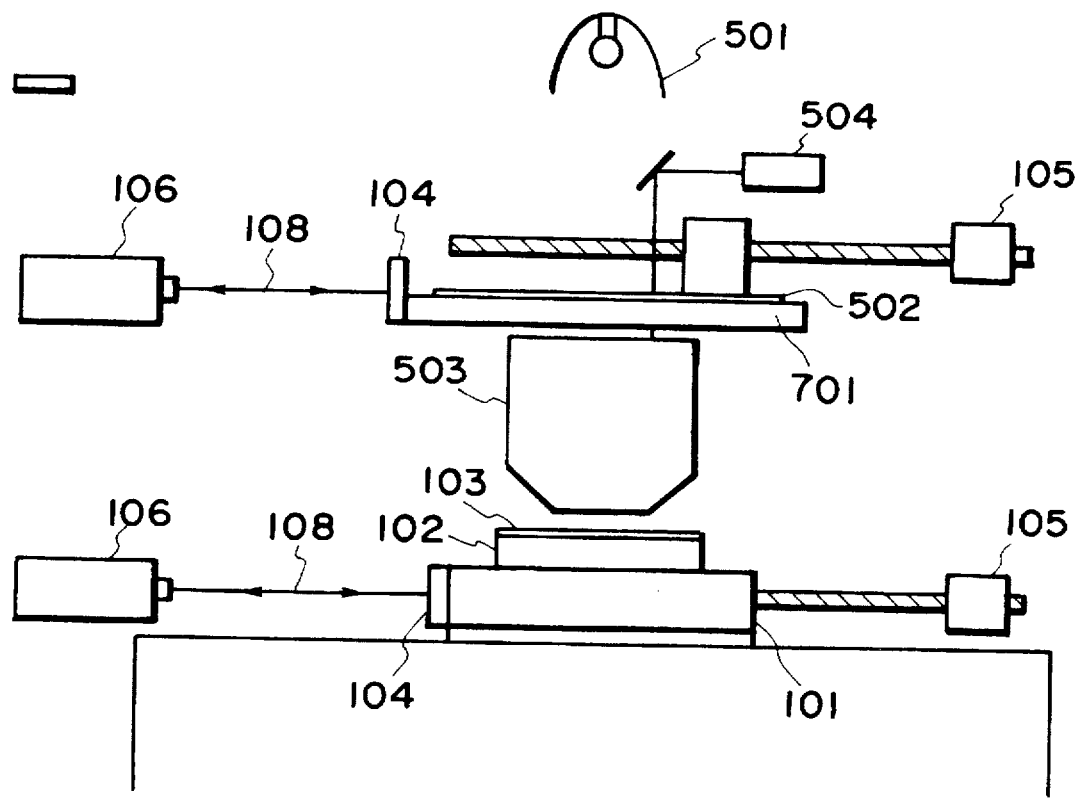
FIG. 7 is a schematic view of a scanning exposure apparatus according to an embodiment of the present invention.

FIG. 7 shows the structure of a scanning exposure apparatus according to an embodiment of the present invention. In this apparatus, a reticle stage 701 and a wafer stage 101 are moved in a timed relation by which enlargement of exposure view angle is attained with a small diameter lens. However, if the reticle stage 701 and the wafer stage 101 are not moved synchronously with very high precision, magnification or the exposure amount within the view angle becomes non-uniform. For attaining high precision driving, laser distance measuring devices 106 are used to detect the positions of the reticle stage 701 and the wafer stage 101, and theses stages are driven by their motors 105 while feeding back their positional deviations.

Figure 8:
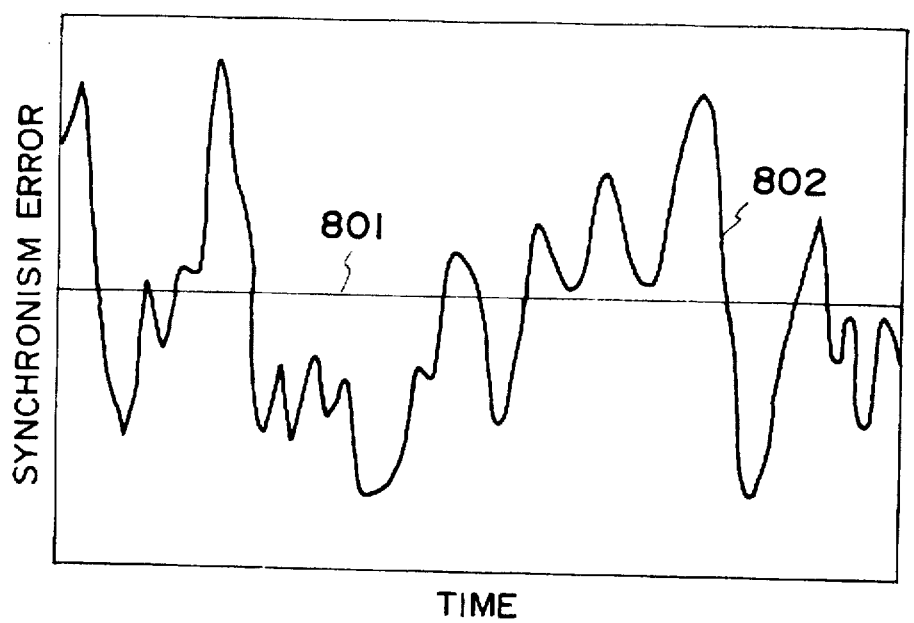
FIG. 8 is a graph for explaining a synchronism error between a reticle stage and a wafer stage during an exposure period.

FIG. 8 illustrates a synchronism error 802 to a designated value 801 for the reticle stage 701 and the wafer stage 101 during the exposure time in the real time AA control, or to the laser distance measuring device 106. In scanning exposure apparatuses, scan axis alignment is particularly difficult to achieve. Therefore, executing the error shot discrimination by taking a standard deviation and means of respective axis in this embodiment, like the preceding embodiment or embodiments, is very effective.

Figure 9:
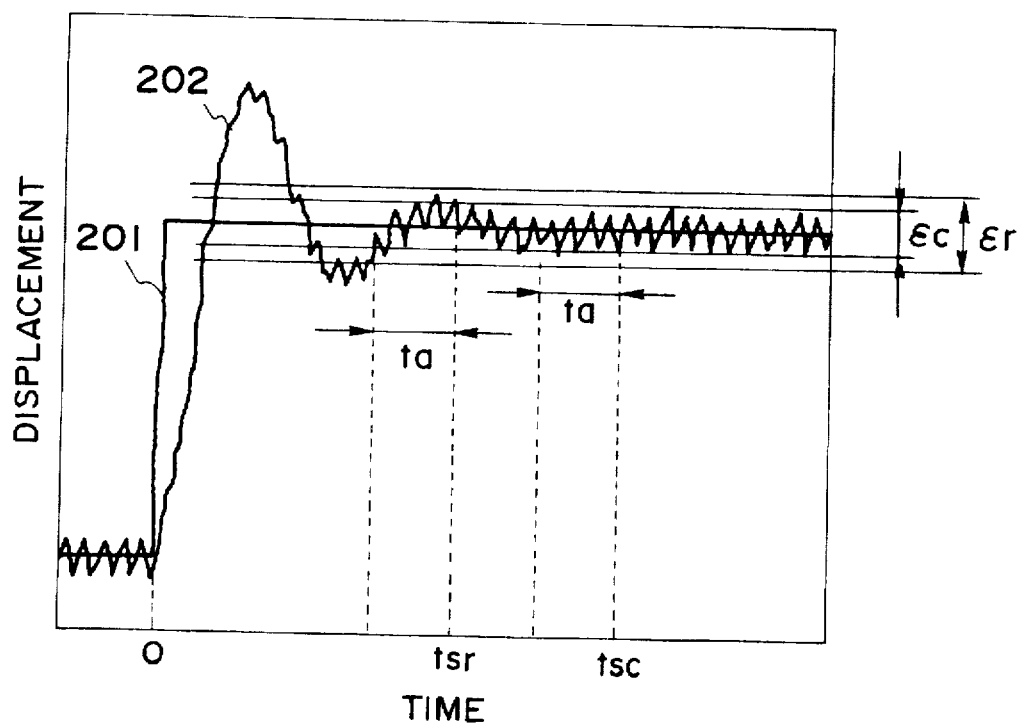
FIG. 9 is a graph for explaining the discrimination of positioning for a critical layer and a rough layer.

FIG. 9 illustrates the manner of positioning discrimination for an X-Y stage 101, for a rough layer and a critical layer. The positioning is completed when the level is held within a threshold range $\epsilon$ for a predetermined period $t_a$, after the level comes into the threshold range $\epsilon$. The threshold $\epsilon$ is determined in accordance with the layer. It is $\epsilon r$ for rough layers, and it is $\epsilon c$ for critical layers. Such a threshold is given by about three times the tolerable amplitude ($\sigma$), naturally and there is a relation $\epsilon r > \epsilon c$. The time from change of a designated value to completion of positioning is given, with respect to respective layers, by $t_{sr}$ and $t_{sc}$ and, naturally, there is a relation $t_{sr} < t_{sc}$.

By determining the tolerance in accordance with the specification of resolution in the manner described above, particularly for rough layers, the positioning time can be reduced and the throughput can be enhanced.

Figure 10A:
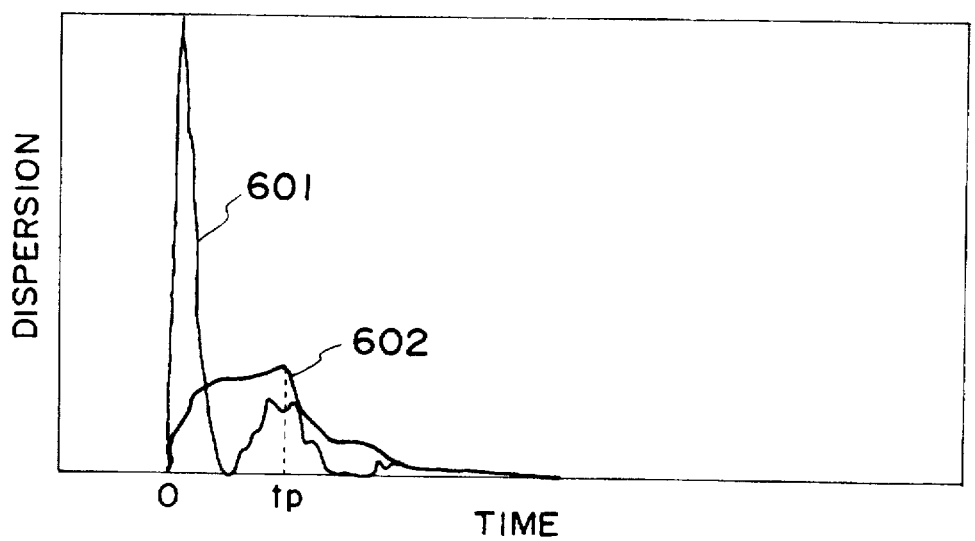
FIGS. 10A and 10B are graphs for explaining the attenuation of the movement average of dispersion of vibration of the X-Y stage of FIG. 1.

FIG. 10A illustrates at 601 the change in a value of a square of the difference between the designated value 201 and the detected position 201 in FIG. 9. Depicted at 602 is movement average of the square 601, and it represents a change in dispersion. The moment of rise of the dispersion 602 is denoted by 0, and the moment of a peak value of dispersion 602 is denoted by tp.

Figure 10B:
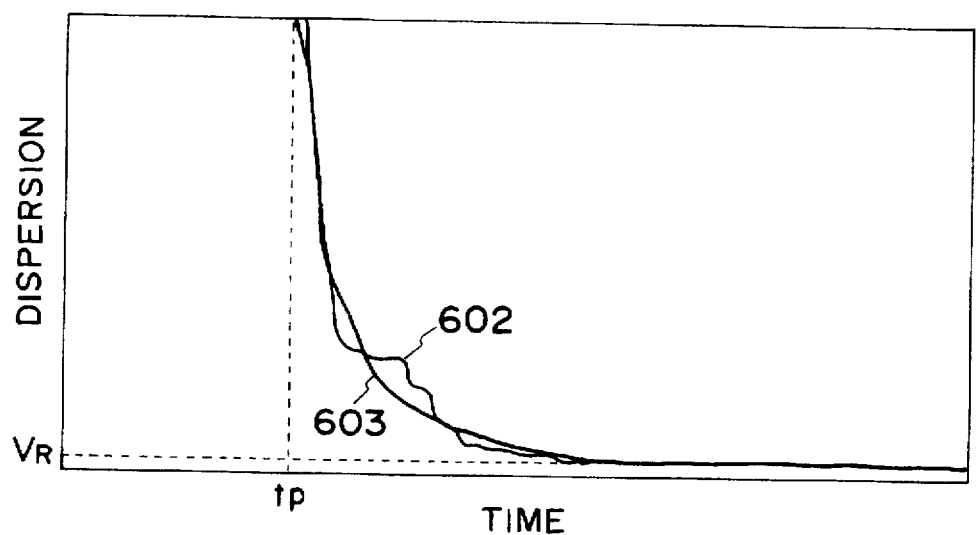

FIG. 10B shows, in enlarged scale, a portion of FIG. 10A in which the dispersion 602 gradually decreases after the time tp. Denoted at 603 is an approximation curve of dispersion 602 and, as an example, it can be approximated in accordance with equation (6) below:

$$V(t)=D/(t-tp)+Vr(t>tp) \qquad (6)$$

where D is a constant of attenuation, and Vr represents the dispersion of residual vibration, which is measured beforehand. In the positioning operation, movement the average of dispersion is measured successively and a discrimination is made as to whether the result corresponds to which portion of the approximation curve, and then the time necessary for convergence to a desired vibration amplitude is calculated.

Next, a method of determining an earliest exposure start time moment ts according to the exposure time T and a design rule L&S, will be explained. As seen in Table 1, a square of the allowable amplitude ($\sigma$) of each line and space corresponds to V(t). That is, for 0.15 micron L&S, if the dispersion on average during the exposure time is not more than 900 nm², a desired resolution is attainable. If dispersion of residual vibration is less than 900 nm², the effect of large vibration becomes smaller with longer exposure time T, and the exposure start time moment ts (>tp) can be made earlier. If dispersion tolerable to obtaining a desired resolution is denoted by Vm, the mean of V(t) during the exposure period may be not more than Vm. That is, it is expressed by equation (7) below:

$$Vm \geq (1/T) \int_{ts}^{ts+T} V(t)dt \qquad (7)$$

Substituting equation (7) into equation (6) for solution in connection with ts, equation (8) below follows and the exposure start moment ts is determined by tolerable dispersion Vm and exposure time T:

$$ts \geq tp+T/(exp(Vm-Vr)T/D)-1) \qquad (8)$$

For example, if D=800 nm², tp=0 sec. and Vr=400 nm², and in the cases of 0.15 L&S and 0.25 L&S, the exposure start moment ts for 0.5 sec. exposure and 1.0 sec. exposure may be summarized as Table 2 below:

TABLE 2

| Exposure Time T | 0.5 sec. | 1.0 sec. |
|---|---|---|
| 0.15 L & S | 1.363 | 1.152 |
| 0.25 L & S | 0.184 | 0.078 |

Figure 11:
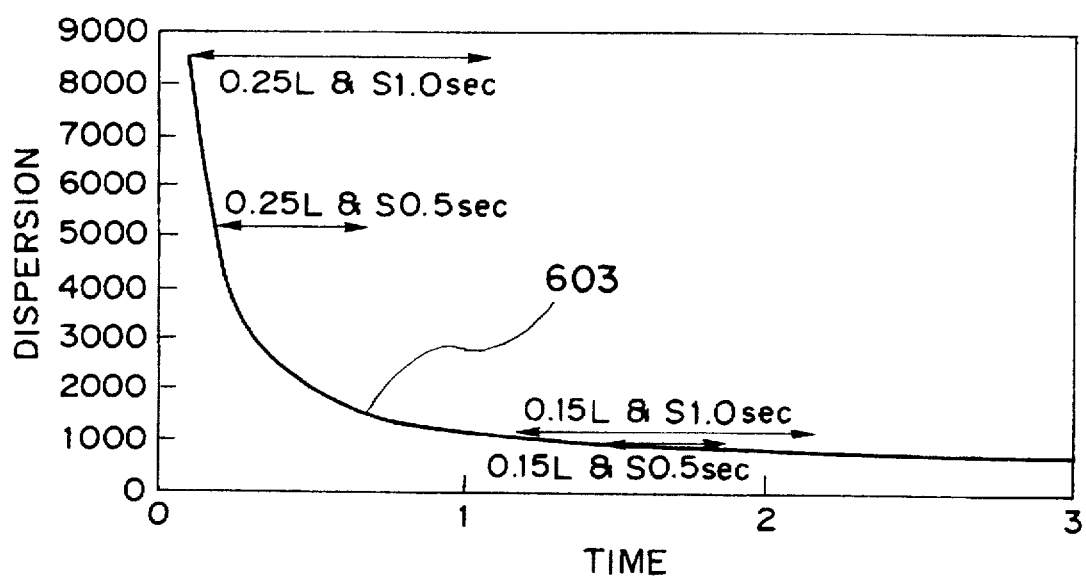
FIG. 11 is a time chart for explaining an exposure time and changes in dispersion of vibration of the X-Y stage of FIG. 1.

FIG. 11 is a time chart of exposure time and changes in the dispersion of vibration. The time from the start of attenuation of vibration to the start of exposure can be reduced much more if the design rule L&S is larger and the exposure time T is longer. Particularly, for critical layers, the shortening effect of time is larger with a longer exposure time, and the throughput enhancement is bigger.

As an alternative, there is a method wherein the movement average of dispersion is successively detected in the positioning operation and, after a desired vibration amplitude is attained, the exposure process starts.

The threshold of vibration amplitude can be expressed in terms of dispersion by substituting equation (8) into equation (6), that is, as equation (9) below:

$$V(ts)=(D/T)\{exp((Vm-Vr)T/D)-1\}+Vr \qquad (9)$$

Namely, the right side of equation (9) may be calculated beforehand and, when the movement average of dispersion becomes not more than that value, the exposure may be started. This provides substantially the same advantageous results as the preceding embodiments.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern of an original to a substrate, comprising:

means for producing information related to a relative positional deviation between the original and the substrate; and discriminating means for discriminating an error shot on the basis of the information, wherein said discriminating means includes storing means for executing sampling of the information at a predetermined interval during an exposure period and for storing the result of sampling, and wherein said discriminating means executes the error shot discrimination by statistically processing the stored information.

2. An apparatus according to claim 1, wherein the statistical processing includes calculation of a mean and a standard deviation of the positional deviation information, and wherein said discriminating means executes the error shot discrimination on the basis of a discrimination as to whether the mean and standard deviation satisfy a predetermined registration precision for the original and the substrate and a predetermined resolution of a transferred image.

3. An apparatus according to claim 2, wherein said discriminating means changes the registration precision and resolution in accordance with an exposure layer.

4. A discrimination method usable in an exposure apparatus for transferring a pattern of an original onto a substrate, said method comprising the steps of:

producing information related to a relative positional deviation between the original and the substrate; and discriminating an error shot on the basis of the information, wherein said discriminating step includes executing sampling of the information at a predetermined interval during an exposure period and storing the result of sampling, wherein in said discriminating step, the error shot discrimination is executed by statistically processing the stored information.

5. A method according to claim 4, wherein the statistical processing includes calculation of a means and a standard deviation of the positional deviation information, and wherein said discriminating step includes executing the error shot discrimination on the basis of a discrimination as to whether the mean and standard deviation satisfy a predetermined registration precision for the original and the substrate and a predetermined resolution of a transferred image.

6. A method according to claim 5, wherein the registration precision and resolution are changed in accordance with an exposure layer.

7. A discrimination method usable in an exposure apparatus for transferring a pattern of an original onto a substrate, said method comprising the steps of:

executing an exposure process after positioning of an X-Y stage with respect to a predetermined shot position is discriminated; and changing a discrimination condition for the positioning in accordance with one of a layer and a shot, wherein discrimination of positioning is based on statistical processing.

8. A method according to claim 7, wherein a threshold for positioning discrimination is changed in accordance with the layer.

9. A method according to claim 7, wherein a threshold for positioning discrimination is changed in accordance with an exposure time.

10. A method according to claim 7, wherein a positioning time is changed in accordance with the layer.

11. A method according to claim 7, wherein a positioning time is changed in accordance with an exposure time.

12. An exposure apparatus for transferring a pattern of an original onto a substrate, comprising:

an X-Y stage for positioning the substrate; and control means serviceable to execute an exposure process after positioning of the X-Y stage with respect to a predetermined shot position is discriminated, wherein said control means serves to change a discrimination condition for the positioning in accordance with one of a layer and a shot, wherein the discrimination of positioning is executed on the basis of statistical processing.

13. An apparatus according to claim 12, wherein a threshold for the positioning discrimination is changed in accordance with the layer.

14. An apparatus according to claim 12, wherein a threshold for the positioning discrimination is changed in accordance with an exposure time.

15. An apparatus according to claim 12, wherein a positioning time is changed in accordance with the layer.

16. An apparatus according to claim 12, wherein a positioning time is changed in accordance with an exposure time.

* * * * *

UNITED STATES PATENT AND TRADEMARK OFFICE
CERTIFICATE OF CORRECTION

PATENT NO.    : 5,760,878
DATED         : June 2, 1998
INVENTOR(S)   : NOBUAKI OGUSHI It is certified that error appears in the above-identified patent and that said Letters Patent is hereby corrected as shown below:

COLUMN 1:

Line 20, "process" should read --process,--; and
    Line 47, "short" should read --shot--.

COLUMN 2:

Line 12, "changes" should read --changes,--.

COLUMN 3:

Line 55, "1/T)" should read --(1/T)--.
    Line 67, "σ" should read --σx--.

COLUMN 5:

Line 55, "naturally and" should read --and naturally--.

COLUMN 6:

Line 12, "movement the" should read --the movement--.

UNITED STATES PATENT AND TRADEMARK OFFICE
CERTIFICATE OF CORRECTION

PATENT NO. : 5,760,878

DATED : June 2, 1998

INVENTOR(S) : NOBUAKI OGUSHI

It is certified that error appears in the above-identified patent and that said Letters Patent is hereby corrected as shown below:

COLUMN 7:

Line 52, "means" should read --mean--.

Signed and Sealed this

Eleventh Day of May, 1999

Q. TODD DICKINSON

Attest:

Attesting Officer

Acting Commissioner of Patents and Trademarks